United States Patent [19]

Maeda

[11] Patent Number: 4,862,086
[45] Date of Patent: Aug. 29, 1989

[54] SYSTEM FOR GENERATING MAGNETIC FIELDS UTILIZED FOR MAGNETIC RESONANCE IMAGING APPARATUS

[75] Inventor: Tomohisa Maeda, Ootawara, Japan

[73] Assignee: Kabushiki Kaisha Toshiba, Kawasaki, Japan

[21] Appl. No.: 184,506

[22] Filed: Apr. 21, 1988

[30] Foreign Application Priority Data

Apr. 28, 1987 [JP] Japan .................................. 62-107559
Jul. 22, 1987 [JP] Japan .................................. 62-183025

[51] Int. Cl.$^4$ ........................................... G01R 33/20
[52] U.S. Cl. .................................................. 324/318
[58] Field of Search ................ 324/309, 318; 128/653; 335/296, 299

[56] References Cited

U.S. PATENT DOCUMENTS 4,297,637 10/1981 Crooks et al. ......................... 324/309
4,714,886 12/1987 Halpern ................................. 324/318
4,728,895  3/1988 Briquet et al. ....................... 324/318

Primary Examiner—Stewart J. Levy
Assistant Examiner—Kevin D. O'Shea
Attorney, Agent, or Firm—Finnegan, Henderson, Farabow, Garrett & Dunner

[57] ABSTRACT

In an MRI apparatus, a static magnetic field is generated by a pair of magnets facing each other within a spacing. An axis direction of a subject inserted within the spacing is orthogonal to that of the static magnetic field. Gradient magnetic fields with X, Y and Z direction are generated by two pairs of plane coils, two pairs of plane coils, and a pair of plane coils, respectively, arranged between a pair of magnets. The plane coils for generated the gradient magnetic field in X direction is the same form as the plane coils for generating the gradient magnetic field in Z direction. By such an arrangement, gradient magnetic fields generated within the spacing have enough magnitude and linearity to obtain magnetic resonance signals. It is also enough spacing to insert a subject.

2 Claims, 9 Drawing Sheets

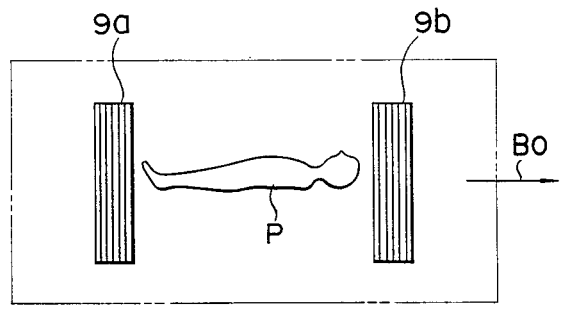
F I G. 3
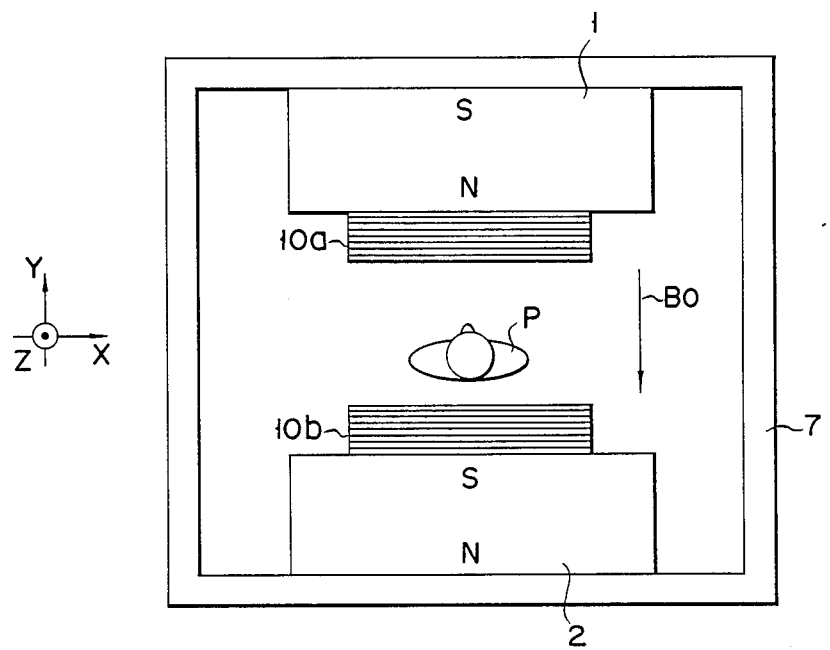
F I G. 4

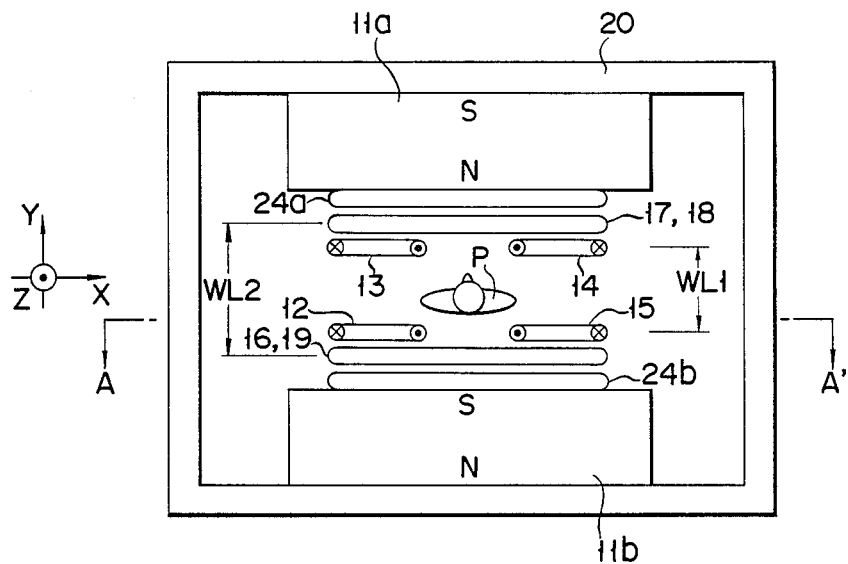
F I G. 5
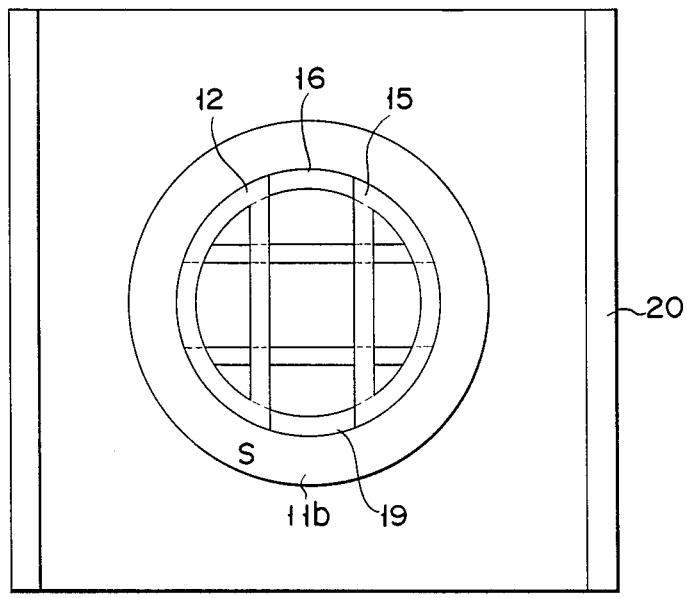
F I G. 6

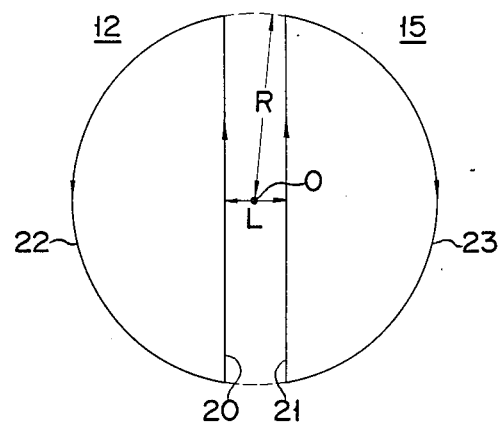
F I G. 7
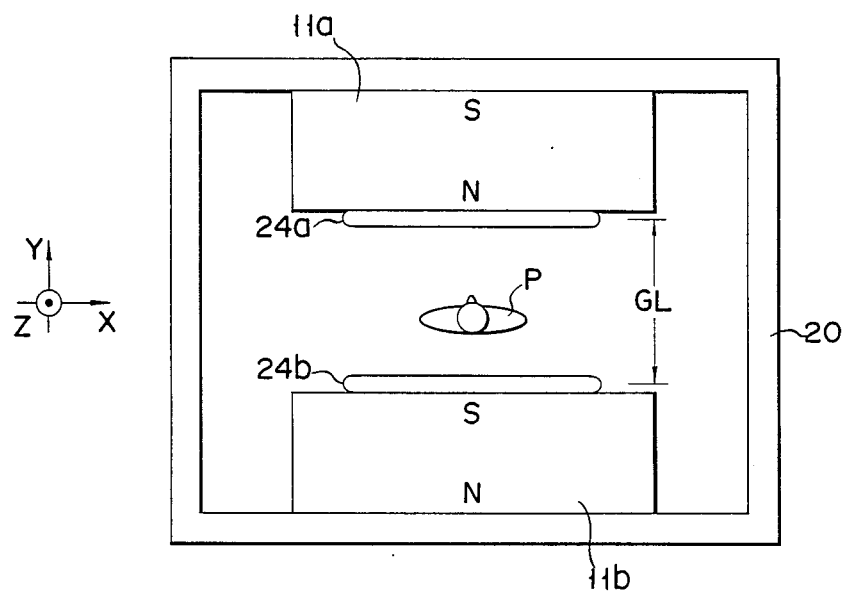
F I G. 8

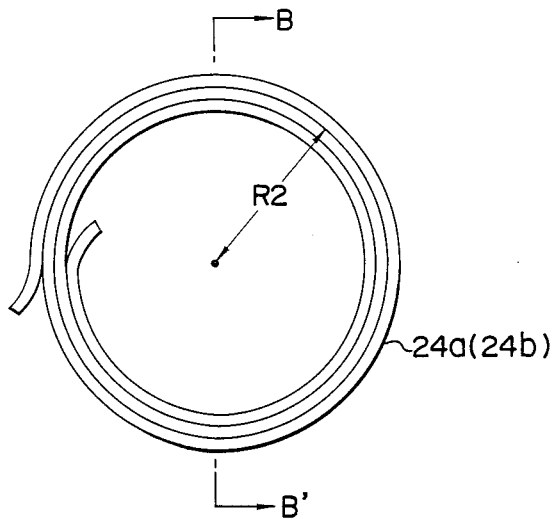
F I G. 9
F I G. 10

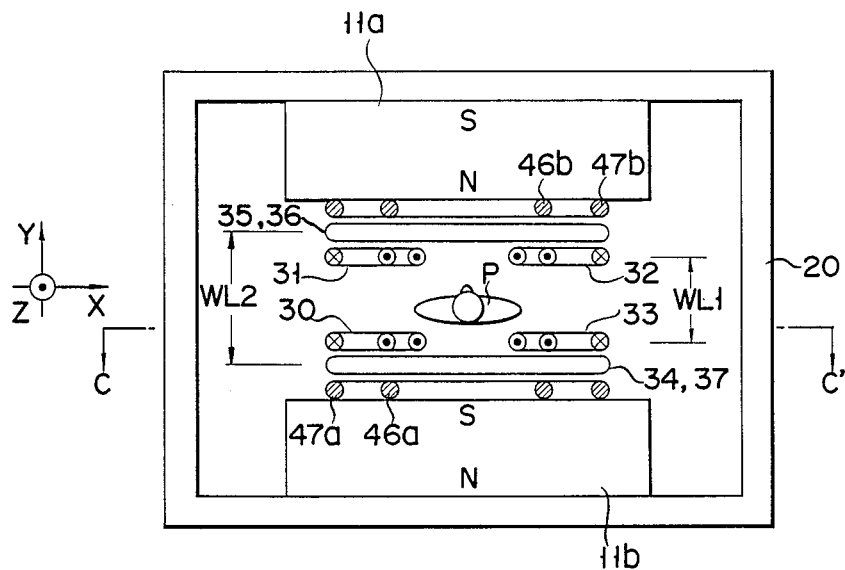
F I G. 11
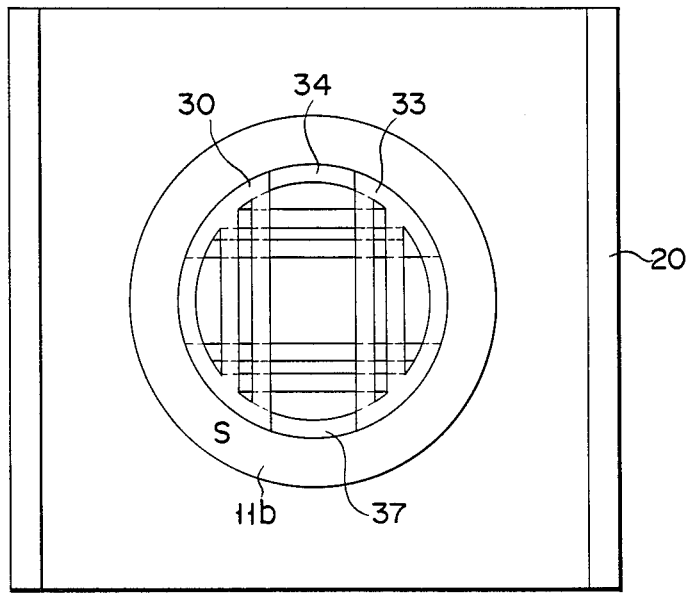
F I G. 12

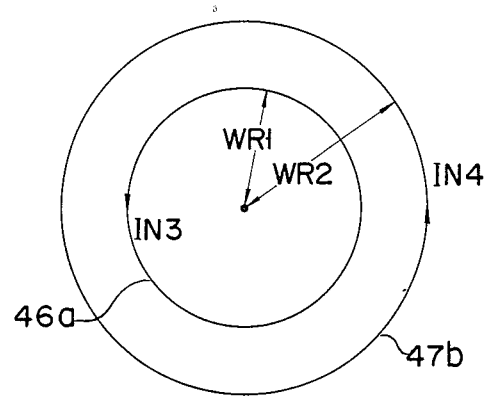
F I G. 16
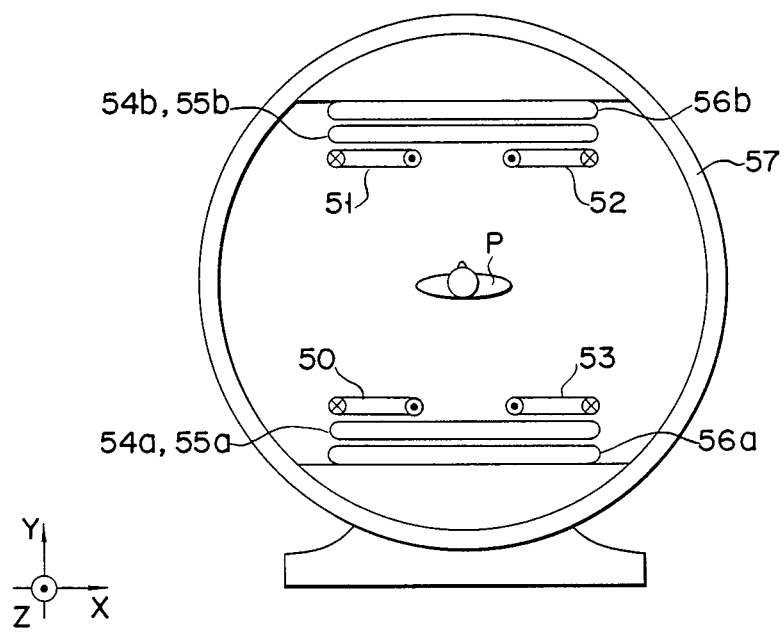
F I G. 17

SYSTEM FOR GENERATING MAGNETIC FIELDS UTILIZED FOR MAGNETIC RESONANCE IMAGING APPARATUS

BACKGROUND OF THE INVENTION

1. Field of the Invention

This invention relates to a magnetic field generating system utilized for a magnetic resonance imaging apparatus.

2. Description of the Related Art

Conventional magnetic resonance imaging apparatus (referred to as MRI apparatus hereinafter) is arranged to generate a uniform static magnetic field, places a subject under examination in the static magnetic field, applies an RF (Radio Frequency) magnetic field in the direction perpendicular to the static magnetic field so that the magnetic resonance phenomenon occurs only within a predetermined slice of the subject, applies linear gradient magnetic fields after termination of the application of the RF field so as to acquire magnetic resonance signals (referred to as MR signals hereinafter) generated from atomic nuclei in the subject, and Fourier transforms the MR signals to reconstruct an image.

The MRI apparatus is equipped with a magnetic field generating device which generates, as shown in FIG. 1, the static magnetic field in the direction orthogonal to the body axis of subject P placed between a pair of permanent magnets 1 and 2 facing each other with a predetermined space therebetween. The magnetic field generating device uses "parallel 4 wires" to generate gradient magnetic fields in Z and X directions orthogonal to each other with the body axis of subject P taken in the Z direction. The parallel 4 wires shown in FIG. 1 are used for generating the gradient magnetic field in the X direction and include parts of coil 3, 4, 5, and 6 wound around permanent magnet 1 or 2 and iron yoke 7. That is, portions of coils 3, 4, 5, and 6 that locate on the opposed faces of permanent magnets 1 and 2 are arranged to be straight and parallel to each other, and these parallel coil portions 3a, 4a, 5a, and 6a form the parallel 4 wires. This secures a space in which subject P is placed. Each of coils 3, 4, 5, and 6 in FIG. 1 have three turns.

In such an arrangement as described above, since the coils are wound around iron yoke 7, the inductance of the coil becomes large, leading to the deterioration of rising characteristics of the gradient magnetic fields. Further, coil portions 3b, 4b, 5b, and 6b of the parallel 4 wires generate magnetic fields in directions opposed to those of predetermined gradient magnetic fields, so that the intensity of magnetic fields decreases and the linearity of the gradient magnetic fields deteriorates.

When a static magnetic field Bo is generated in the direction of the body axis of subject P as shown in FIG. 2, a gradient magnetic field in the Y direction can be generated by disposing coils 8a and 8b to the direction of the body axis. To obtain a predetermined magnetic field intensity, coils 8a and 8b may be provided with plural turns to the direction of the body axis of subject P like coils 9a and 9b as shown in FIG. 3. However, when static magnetic field Bo is generated in the direction perpendicular to the body axis of subject P as shown in FIG. 4, since permanent magnets 1 and 2 are disposed to the direction of the static magnetic field, coils wound to the direction of the static magnetic field would narrow a space into which subject P under examination is to be inserted. In particular, to generate gradient magnetic fields in the X, Y and Z directions, respective coils must be disposed within the space for inserting subject P.

In view of the above it is desired that the inductance of coils used for generating gradient magnetic fields can be small, gradient magnetic fields have sufficient intensity and linearity, and a sufficient space for a subject under examination can be secured.

SUMMARY OF THE INVENTION

It is an object of this invention to provide a magnetic field generating system for a magnetic resonance imaging apparatus in which the inductance of coils used for generating gradient magnetic fields is small, gradient magnetic fields have sufficient intensity and linearity, and a sufficient space for a subject under examination can be secured.

According to one aspect of the present invention, there is provided a system for generating magnetic fields utilized for magnetic resonance imaging apparatus, the system comprising: magnetic field generating means for generating a static magnetic field in a direction orthogonal to an axis direction of a subject inserted within a spacing by arranging a pair of magnets facing each other; first coil means including at least first one pair of plane coils facing each other between the pair of magnets for generating a first gradient magnetic field within the spacing in a direction; second coil means including at least second one pair of plane coils facing each other between the pair of magnets for generating a second gradient magnetic field within the spacing in a direction orthogonal to the direction of the first gradient magnetic field generated by the first coil means; and third coil means including at least third one pair of plane coils facing each other between the pair of magnets for generating a third gradient magnetic field within the spacing in a direction orthogonal to the direction of the first gradient magnetic field generated by the first coil means and that of the second gradient magnetic field generated by the second coil means.

According to another aspect the present invention, there is provided a system for generating magnetic fields utilized for magnetic resonance imaging apparatus, the system comprising: magnetic field generating means for generating a static magnetic field in a direction orthogonal to an axis direction of a subject inserted within a spacing by arranging at least one of coils outside the spacing; first coil means including at least first one pair of plane coils facing each other inside at least the one of coils for generating a first gradient magnetic field within the spacing in a direction; second coil means including at least second one pair of plane coils facing each other inside at least the one of coils for generating a second gradient magnetic field within the spacing in a direction orthogonal to the direction of the first gradient magnetic field generated by the first coil means; and third coil means including at least third one pair of plane coils facing each other inside at least the one of coils for generating a third gradient magnetic field within the spacing in a direction orthogonal to the direction of the first gradient magnetic field generated by the first coil means and that of the second gradient magnetic field generated by the second coil means.

BRIEF DESCRIPTIONS OF THE DRAWINGS

FIG. 3 shows coils for generating a gradient magnetic field with a predetermined intensity in FIG. 2;

FIG. 4 shows an arrangement of coils for generating a gradient magnetic field in a direction orthogonal to the body axis of the subject in FIG. 1;

FIG. 5 shows an arrangement of coils for generating magnetic fields according to an embodiment of this invention;

FIG. 6 is a sectional view obtained along the line A-A' in FIG. 5;

FIG. 7 is a schematic view for explaining the shape of the coils shown in FIG. 6;

FIG. 8 shows the arrangement of the coils for generating a gradient magnetic field in the Y direction in FIG. 5;

FIG. 9 is a schematic view for explaining the shape of the coil shown in FIG. 8;

FIG. 10 is a sectional view obtained along the line B-B' of FIG. 9;

FIG. 11 shows an arrangement of coils for generating magnetic fields according to another embodiment of this invention;

FIG. 12 is a sectional view obtained along the line C-C' of FIG. 11;

FIG. 16 is a schematic view for explaining the shape of the coil of FIG. 15; and FIG. 17 shows an arrangement for generating a static magnetic field by the use of coils.

DETAILED DESCRIPTION OF THE PREFERRED EMBODIMENTS

Figure 1:
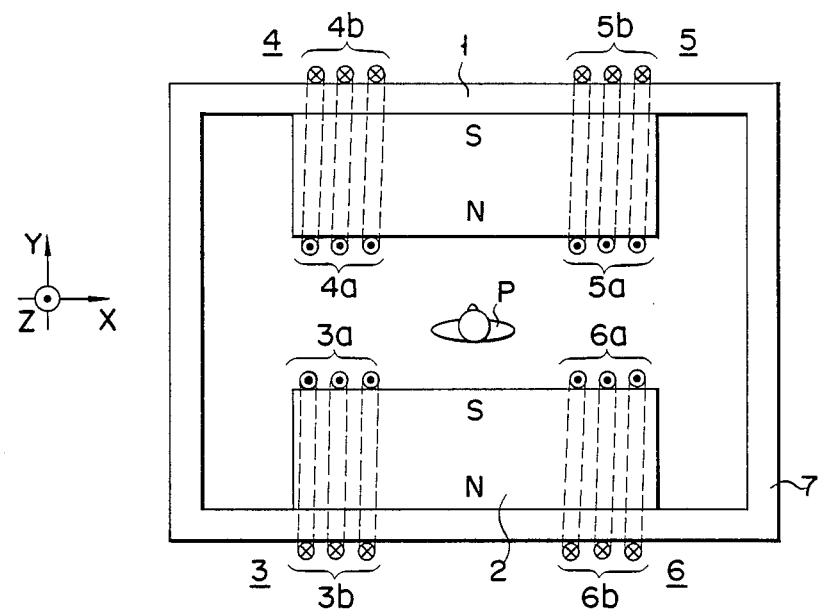
FIG. 1 shows a conventional arrangement of coils used for generating magnetic fields.
Figure 2:
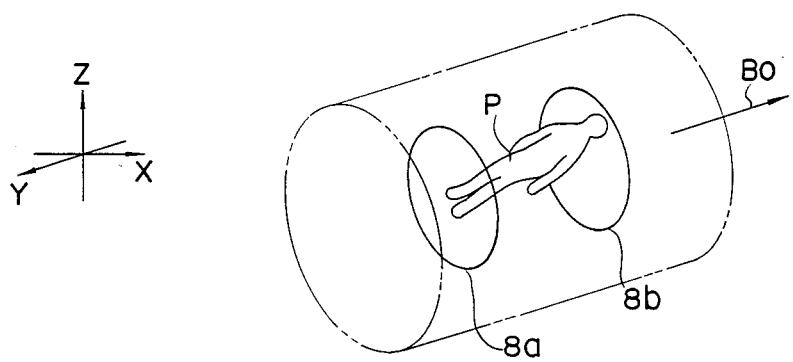
FIG. 2 shows an arrangement for generating a gradient magnetic field along the body axis of a subject under examination.

An embodiment of the present invention will be described with reference to the accompanying drawings.

Referring now to FIGS. 5 and 6, coils 12 to 15 for generating a gradient magnetic field in the X direction, coils 24a and 24b for generating a gradient magnetic field in the Y direction, and coils 16 to 19 for generating a gradient magnetic field in the Z direction are disposed between a pair of permanent magnets 11a and 11b of disk form. Each coil is electrically insulated. In these coils, coil 12 (15) disposed near permanent magnet 11b is comprised of a straight portion 20 (21) and a return portion 22 (23) as shown in FIG. 7. Straight portions 20 and 21 are each parallel to the body axis (the Z direction) of subject P under examination in this case, and return portions 22 and 23 are each formed to locate on a circle with the center at midpoint O of the line connecting the midpoints of straight portions 20 and 21. Coils 16 and 19 for generating a gradient magnetic field in the Z direction are the same shape as coils 12 and 15 for generating a gradient magnetic field in the X direction, are rotated in the Z-X plane by an angle of 90 degrees relative to coils 12 and 15. Coils 13, 14, 17 and 18 disposed near permanent magnet 11a are arranged in the same manner as coils 12, 15, 16 and 19.

When the distance between straight portions 20 and 21 is L, the distance between midpoint O and return portion 22 (23) is R, and the space between coils 12 and 13 (coils 14 and 15) is WL1, L and R must be determined in the following equations.

$$L = \alpha \cdot WL1 \qquad (1)$$

$$R = \beta \cdot WL1 \qquad (2)$$

where $0.3 \leq \alpha \leq 0.6$, $0.7 \leq \beta \leq 1.5$, and $\alpha, \beta$ are constants depending on the size of a slice within subject P under examination and the linearity of the gradient magnetic fields. When the spacing between coils 16 and 17, (coils 18 and 19) is WL2, the equations (1) and (2) are expressed by changing the spacing WL1 for the spacing WL2. Thus, straight portions 20 and 21 generate a gradient magnetic field in the same direction, so that the field intensity will not decrease and the field linearity will not be deteriorated. Further, in FIG. 1, the coils need not to be wound around an iron yoke, so that the inductance of the coils can be made small as compared with that in FIG. 1, thus improving the rising characteristics of the gradient magnetic fields.

Although electrical connection of each coil is not shown, each coil is connected to a power supply (not shown) by lead wires. To obtain a predetermined field intensity the number of turns of each coil may be more than or equal to two.

Following the description of coils 12 to 19 for generating gradient magnetic fields in the Z and X directions, the arrangement of coils 24a and 24b for generating a gradient magnetic field in the Y direction will be described.

As shown in FIGS. 8 to 10, coils 24a and 24b for generating gradient magnetic field in the Y direction are disposed to face each other in the vicinity of permanent magnets 11a and 11b, respectively, and have the form of a spiral. Adjacent conductor wires of coils are in contact with each other. When the spacing between coils 24a and 24b is GL, and the distance between the center of the coil and the center of the conductor wires is R2, the gradient magnetic field with good linearity can be generated in the Y direction by determining the distance R2 in the following equation.

$$R2 = \gamma \cdot GL \qquad (3)$$

where $0.8 \leq \gamma < 1.4$.

As described above, according to this invention, coils 12 to 19, 24a and 24b for generating gradient magnetic fields in the X, Y and Z directions are disposed levelly (in plane form) and parallel to permanent magnets 11a and 11b. Therefore, a space for placing a subject under examination can be secured.

Next, another embodiment of this invention will be described.

Figure 13:
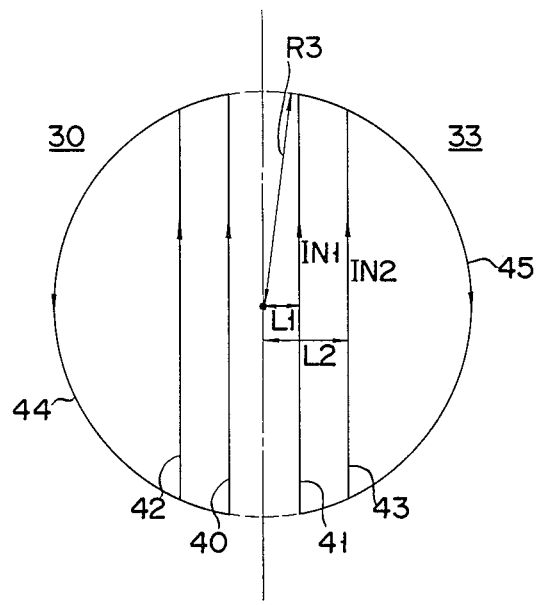
FIG. 13 is a schematic view for explaining the shape of the coil shown in FIG. 12.

In FIGS. 11 and 12, coils 30 to 33 for generating a gradient magnetic field in the X direction, coils 46a, 46b, 47a, and 47b for generating a gradient magnetic field in the Y direction, and coils 34 to 37 for generating a gradient magnetic field in the Z direction are all disposed between a pair of permanent magnets 11a and 11b. It is to be noted that coils 46a, 46b, 47a and 47b shown in FIG. 11 are not shown in FIG. 12. Coils 30 and 33 disposed near permanent magnet 11b comprise first straight portions 40 and 41, second straight portions 42 and 43 parallel to the first straight portions 40 and 41, and return portions 44 and 45, respectively, as shown in FIG. 13. Straight portions 40 to 43 are parallel to the body axis (the Z direction) of subject P, and return portions 44 and 45 are located on a circle of radius R3 with the center at the midpoint of the line connecting the midpoints of first straight portions 40 and 41. When the spacing between coils 30 and 31 (coils 32 and 33) is WL1, then the distance L1 between first straight portion 40 (41) and the center line, and the distance L2 between second straight portion 42 (43) and the center line are given by $$L2 = a \cdot WL1 \tag{4}$$

$$L1 = b \cdot L2 \tag{5}$$

where $0.1 \leq a \leq 1.3$, $0.1 \leq b < 1$.

Further, the product $I \cdot N1$ of a current flowing through first straight portions 40 and 41 and the number of turns, and the product $I \cdot N2$ of a current flowing through second straight portions 42 and 43 and the number of turns should be related by $$I \cdot N1 = c \cdot I \cdot N2 \tag{6}$$

where $0.1 \leq c < 1$.

Moreover, the radius R3 is determined by $$R3 = d \cdot WL1 \tag{7}$$

where $0.7 \leq d < 1.5$.

When the spacing between coils 34 and 35 (coils 36 and 37) is WL2, the equations (4) and (7) are expressed by changing the spacing WL1 for the spacing WL2.

Thus, straight portions generate a gradient magnetic field in the same direction, so that the field intensity will not decrease and the field linearity will not be deteriorated. Each coil is connected to a power supply by lead wires. Coils 34 and 37 for generating the gradient magnetic field in the Z direction have the same shape as coils 30 and 33 for generating the gradient magnetic field in the X direction, are rotated in the Z-X plane by an angle of 90 degrees relative to coils 30 and 33.

Figure 14:
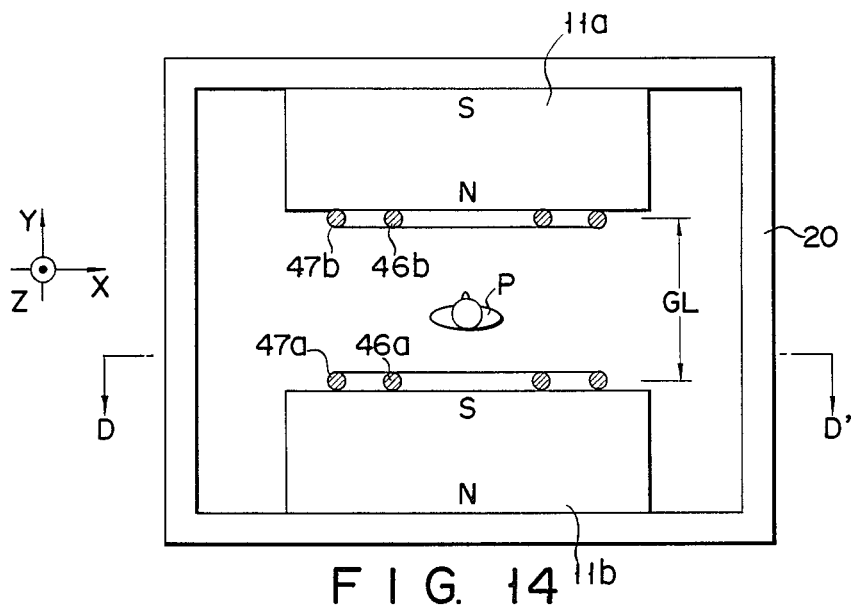
FIG. 14 shows the arrangement of the coils for generating a gradient magnetic field in the Y direction in FIG. 11.
Figure 15:
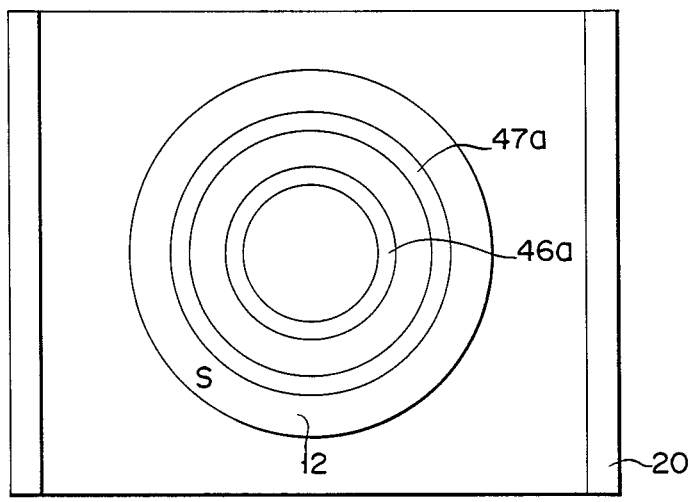
FIG. 15 is a sectional view obtained along the line D-D' of FIG. 14.

Referring to FIGS. 14, 15 and 16 the arrangement of coils for generating the gradient magnetic field in the Y direction will be described.

Coils 46a and 47a; 46b and 47b for generating the gradient magnetic field in the Y direction are disposed on concentric circles of radii WR1 and WR2 near a pair of permanent magnets 11a and 11b facing each other with a predetermined spacing therebetween. The radii WR1 and WR2 of the concentric coils e.g., 46a and 47a are determined by the following equation.

$$WR2 = e \cdot GL \tag{8}$$

$$WR1 = f \cdot WR2 \tag{9}$$

where $0.3 \leq e \leq 1.5$, $0.1 \leq f < 1$.

A current I2 flowing through coils 46a and 47a and the numbers N3 and N4 of turns of coils 46a and 47a should be related by $$I2 \cdot N3 = g \cdot I2 \cdot N4 \tag{10}$$

where $0.05 \leq g \leq 1$. When $WR1 < WR2$, $I2 \cdot N3 < I2 \cdot N4$.

Although the preferred embodiments of this invention have been disclosed and described, it is apparent that other embodiments and modification of the invention are possible.

Although, in the above-described embodiments, the static magnetic field is generated by using permanent magnets, it can be generated by a coil 57 as shown in FIG. 17. In FIG. 17, coils 50 to 53 generate a gradient magnetic field in the X direction, coils 54a, 54b, 55a, and 55b generate a gradient magnetic field in the Z direction, and coils 56a and 56b generate a gradient magnetic field in the Y direction. These coils are arranged in the same manner as the above-described coils (FIG. 5). Further, the return portions of the coils for generating gradient magnetic fields in the X and Y directions need not to be located on a circle. Although each of the coils for generating gradient magnetic fields in the X and Y directions is divided into two sections, the number of coils is not limited to two. Moreover, the coils for generating gradient magnetic field in the X and Z directions and the coils for generating magnetic field in the Y direction, used in the two embodiment of the invention, can be combined.

What is claimed is:

1. A system for generating magnetic fields utilized for magnetic resonance imaging apparatus, the system comprising:

magnetic field generating means for generating a static magnetic field relative to a subject positioned within a space by arranging a pair of magnets facing each other;

first coil means, including at least one pair of first plane coils facing each other between the pair of magnets, for generating a first gradient magnetic field within the space, each said first plane coil having at least one circular concentric turn;

second coil means, including at least one pair of second plane coils facing each other between the pair of magnets, for generating a second gradient magnetic field within the space, each said second plane coil having at least one turn; and third coil means, including at least one pair of third plane coils facing each other between the pair of magnets, for generating a third gradient magnetic field within the space, each said third plane coil having at least one turn;

wherein each of said second plane coil and third plane coil includes at least one straight portion corresponding to a chord and a return portion corresponding to an arc.

2. A system for generating magnetic fields utilized for magnetic resonance imaging apparatus, the system comprising:

magnetic field generating means for generating a static magnetic field relative to a subject positioned within a space by arranging at least one static field coil outside the space, the static field coil being ring-shaped;

first coil means, including at least one pair of first plane coils facing each other inside said at least one static field coil, for generating a first gradient magnetic field within the space, each of said first plane coil having at least one circular concentric turn;

second coil means, including at least one pair of second plane coils facing each other inside said at least one static field coil, for generating a second gradient magnetic field within the space, each said second plane coil having at least one turn; and third coil means, including at least one pair of third plane coils facing each other inside said at least one static field coil, for generating a third gradient magnetic field within the space, each said third plane coil having at least one turn;

wherein the second plane coil and the third plane coil include at least one straight portion corresponding to a chord and a return portion corresponding to an arc.

* * * * *